(12) United States Patent
Vashchenko et al.

(10) Patent No.: US 7,037,814 B1
(45) Date of Patent: May 2, 2006

(54) SINGLE MASK CONTROL OF DOPING LEVELS

(75) Inventors: Vladislav Vashchenko, Palo Alto, CA (US); Andy Strachan, Santa Clara, CA (US); Peter J. Hopper, San Jose, CA (US); Philipp Lindorfer, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 21 days.

(21) Appl. No.: 10/683,858

(22) Filed: Oct. 10, 2003

(51) Int. Cl.
*H01L 21/22* (2006.01)
*H01L 21/38* (2006.01)

(52) U.S. Cl. .................. 438/542; 438/134; 438/139; 438/140

(58) Field of Classification Search ............ 438/542, 438/942, 133, 134, 139, 140, 543, 414, 415, 438/530; 430/300–331
See application file for complete search history.

(56) References Cited

U.S. PATENT DOCUMENTS

| | | | | |
|---|---|---|---|---|
| 3,855,007 A | * | 12/1974 | Polata et al. ............... 438/373 |
| 4,151,010 A | * | 4/1979 | Goth ........................ 438/339 |
| 4,224,083 A | * | 9/1980 | Cresswell ................... 438/134 |
| 4,311,534 A | * | 1/1982 | Bartko et al. ............... 438/139 |
| 4,604,790 A | * | 8/1986 | Bonn ........................ 438/450 |
| 4,755,862 A | * | 7/1988 | Noguier et al. ............. 257/110 |
| 4,827,497 A | * | 5/1989 | Norris et al. ............. 379/27.07 |
| 4,914,045 A | * | 4/1990 | Webb et al. ................ 438/107 |
| 4,927,772 A | * | 5/1990 | Arthur et al. .............. 438/140 |
| 4,967,256 A | * | 10/1990 | Pathak et al. .............. 257/112 |
| 5,001,537 A | * | 3/1991 | Colman et al. ............. 257/173 |
| 5,014,018 A | * | 5/1991 | Rodwell et al. ............. 333/20 |
| 5,150,271 A | * | 9/1992 | Unterweger et al. ........ 361/119 |
| 5,204,273 A | * | 4/1993 | Kuhnert et al. ............. 438/137 |
| 5,288,650 A | * | 2/1994 | Sandow ..................... 438/766 |
| 5,300,454 A | * | 4/1994 | Taft et al. .................. 438/234 |
| 5,358,890 A | * | 10/1994 | Sivan et al. ................ 438/450 |
| 5,384,475 A | * | 1/1995 | Yahata ...................... 257/314 |
| 5,479,031 A | * | 12/1995 | Webb et al. ................ 257/173 |
| 5,516,705 A | * | 5/1996 | Webb et al. ................ 438/133 |
| 5,557,131 A | * | 9/1996 | Lee .......................... 257/370 |
| 5,567,645 A | * | 10/1996 | Ahn et al. ................... 438/439 |
| 5,604,373 A | * | 2/1997 | Susak et al. ................ 257/546 |
| 5,728,612 A | * | 3/1998 | Wei et al. .................. 438/200 |
| 5,801,836 A | * | 9/1998 | Bakowski et al. .......... 257/487 |
| 5,843,796 A | * | 12/1998 | Disney ...................... 438/133 |
| 5,869,366 A | * | 2/1999 | Honnigford et al. ........ 438/200 |
| 5,962,878 A | * | 10/1999 | Takizawa ................... 257/173 |
| 6,150,200 A | * | 11/2000 | Merchant ................... 438/133 |

(Continued)

FOREIGN PATENT DOCUMENTS

JP 355143030 A * 11/1980

OTHER PUBLICATIONS

Jaeger, Richard C. Introduction to Microelectronic Fabrication, vol. V, Addison-Wesley, 1993. pp. 51-57 and 99-103.*

*Primary Examiner*—Alexander Ghyka
(74) *Attorney, Agent, or Firm*—Jurgen Vollrath

(57) ABSTRACT

In an integrated circuit, dopant concentration levels are adjusted by making use of a perforated mask. Doping levels for different regions across an integrated circuit can be differently defined by making use of varying size and spacings to the perforations in the mask. The diffusion of dopant is completed by making use of an annealing stage.

7 Claims, 4 Drawing Sheets

U.S. PATENT DOCUMENTS

| | | | |
|---|---|---|---|
| 6,171,929 B1 * | 1/2001 | Yang et al. | 438/427 |
| 6,222,253 B1 * | 4/2001 | Sadana et al. | 257/617 |
| 6,259,134 B1 * | 7/2001 | Amaratunga et al. | 257/330 |
| 6,274,910 B1 * | 8/2001 | Yu | 257/355 |
| 6,287,930 B1 * | 9/2001 | Park | 438/369 |
| 6,300,171 B1 * | 10/2001 | Frisina | 438/140 |
| 6,355,508 B1 * | 3/2002 | Porter et al. | 438/140 |
| 6,407,901 B1 * | 6/2002 | Casey et al. | 361/119 |
| 6,417,078 B1 * | 7/2002 | Dolan et al. | 438/480 |
| 6,426,520 B1 * | 7/2002 | Traijkovic et al. | 257/107 |
| 6,440,805 B1 * | 8/2002 | Wang et al. | 438/282 |
| 6,469,368 B1 * | 10/2002 | Galster | 257/611 |
| 6,503,783 B1 * | 1/2003 | Mouli | 438/154 |
| 6,555,894 B1 * | 4/2003 | Beasom | 257/593 |
| 6,559,507 B1 * | 5/2003 | Vashchenko et al. | 257/356 |
| 6,586,317 B1 * | 7/2003 | Vashchenko et al. | 438/510 |
| 6,630,698 B1 * | 10/2003 | Deboy et al. | 257/285 |
| 6,642,558 B1 * | 11/2003 | Letavic et al. | 257/219 |
| 6,660,602 B1 * | 12/2003 | Vashchenko et al. | 438/301 |
| 6,717,219 B1 * | 4/2004 | Vashchenko et al. | 257/355 |
| 6,781,161 B1 * | 8/2004 | Turner et al. | 257/109 |
| 6,784,029 B1 * | 8/2004 | Vashchenko et al. | 438/129 |
| 6,787,400 B1 * | 9/2004 | Porter et al. | 438/140 |
| 6,815,732 B1 * | 11/2004 | Vashchenko et al. | 257/107 |
| 2004/0012034 A1 * | 1/2004 | Ducreux | 257/110 |

* cited by examiner

SINGLE MASK CONTROL OF DOPING LEVELS

FIELD OF THE INVENTION

The invention relates to a method of controlling doping levels in an integrated circuit. It also relates to a method of controlling the breakdown voltage between the active region and the substrate of a snapback device.

BACKGROUND OF THE INVENTION

Recent trends in integrated circuits is the inclusion of all analog functional blocks in a single chip. In doing so, however, consideration has to be given to the fact that there are different voltage requirements for different functional blocks on a chip. For instance, the power supply voltage will typically be quite different from the signal voltage of the input and output signals. The analog blocks may therefore be required to provide the necessary power supply for certain output devices such as USB devices. This is seen, for example, in the automotive industry where new standards require a supply voltage level of 42 V. Thus integrated circuits, which now abound in motor vehicles, have to be compatible with the particular power supply level. The need for a cost-effective solution becomes particularly significant in the case of low cost electronics such as imaging and low cost sensors. Using high voltage processes for such applications is therefore economically not feasible. An alternative approach is to use a multiple chip solution to perform the voltage conversion. However, this is not only cumbersome but also costly.

A cost effective solution to handling different voltage levels is therefore required. For example, National Semiconductor Corporation deals with bi-directional ESD protection devices implemented in a 5 V process that have to provide 60V ESD protection at the input pads while the core of the chip still uses 5V.

More generally, it is desirable to be able to provide a semiconductor chip with different functional blocks operating at different voltage levels or having different breakdown voltages. Furthermore it is desirable to achieve this without having to incur additional process steps, such as additional mask or doping steps.

SUMMARY OF THE INVENTION

The present invention provides a method of varying doping levels across an integrated circuit (IC) by using a perforated mask with varying ratios of masked portion to unmasked portion. Thus some regions of the mask will have more unmasked portions to allow more dopant to pass through the mask, and some regions will have more masked portions and block more of the dopant.

Further, according to the invention, there is provided a method of varying the breakdown voltages of snapback devices on an integrated circuit by using a mask of varying degrees of perforation during formation of isolation layers. This allows the dopant concentration to be varied for isolation layers between, for example, a well and a substrate.

Still further, according to the invention, there is provided a method of controlling the breakdown voltage of a snapback device, comprising controlling doping levels of an isolation region by using a perforated mask during doping of the isolation region.

Still further, according to the invention, there is provided a method of increasing the breakdown voltage of a snapback device (e.g., an ESD protection or high voltage device) comprising forming an isolation layer between active regions (e.g. n-wells) and substrate of the device, by means of spotted implants. The spotted implants are typically achieved by making use of a mask with intermittent openings. Preferably the spotted implants are provided before one or both of an epitaxial layer being grown and high diffusion drive taking place.

Still further, according to the invention, there is provided a method of controlling the doping level of a doped region in an integrated circuit, comprising using a perforated mask during doping of the doped region, with the mask having a predefined ratio of perforation to mask material.

DETAILED DESCRIPTION OF THE INVENTION

The present invention provides a way of controlling the doping level for a particular region of a device. For example, an isolation region with a particular doping density can be formed between an active region and a substrate of a snapback device such as a DIAC. This is achieved by making use of a perforated mask to act like a sieve or filter, thereby limiting the amount of dopant that the region is exposed to. By appropriately choosing the ratio of unmasked to masked portion over the device region (i.e. by controlling the size and density of the perforations in the mask), the present invention achieves a desired doping density.

In choosing the perforation size and spacing between perforations, the typical distribution profile of dopant in the semiconductor material is taken into consideration. As the dopant diffuses into the semiconductor material it assumes a Gaussian distribution profile in all three dimensions, as a function of time and temperature. Thus, annealing the doped region causes the dopant to spread out in Gaussian manner. In order to ultimately achieve a relatively uniform continuous doped region under the perforated mask of the invention, the perforations (unmasked portions) have to be closer than the ultimate doping diffusion. Thus process steps such as high diffusion drive and subsequent epitaxial growth, contribute to the distribution of the dopant.

As mentioned above, the Gaussian distribution profile extends not only laterally, but also vertically. Therefore shallower implants with less room for vertical diffusion cannot be exposed to as much annealing. Hence, to achieve a continuous doped layer, the perforations in the mask have to be closer together than is possible with deep implants.

The invention also provides a way of achieving different doping levels across different regions of a single integrated circuit. In particular, it achieves this by using a single mask and providing different size perforations in the mask. In other words the mask is etched differently in different regions to provide for larger or more numerous perforations (unmasked portions) in some regions than in others. By appropriately choosing the ratio of unmasked to masked portion over the device region, the present invention achieves a desired doping density. This will be described in more detail with reference to FIGS. 3 and 4.

Figure 7:
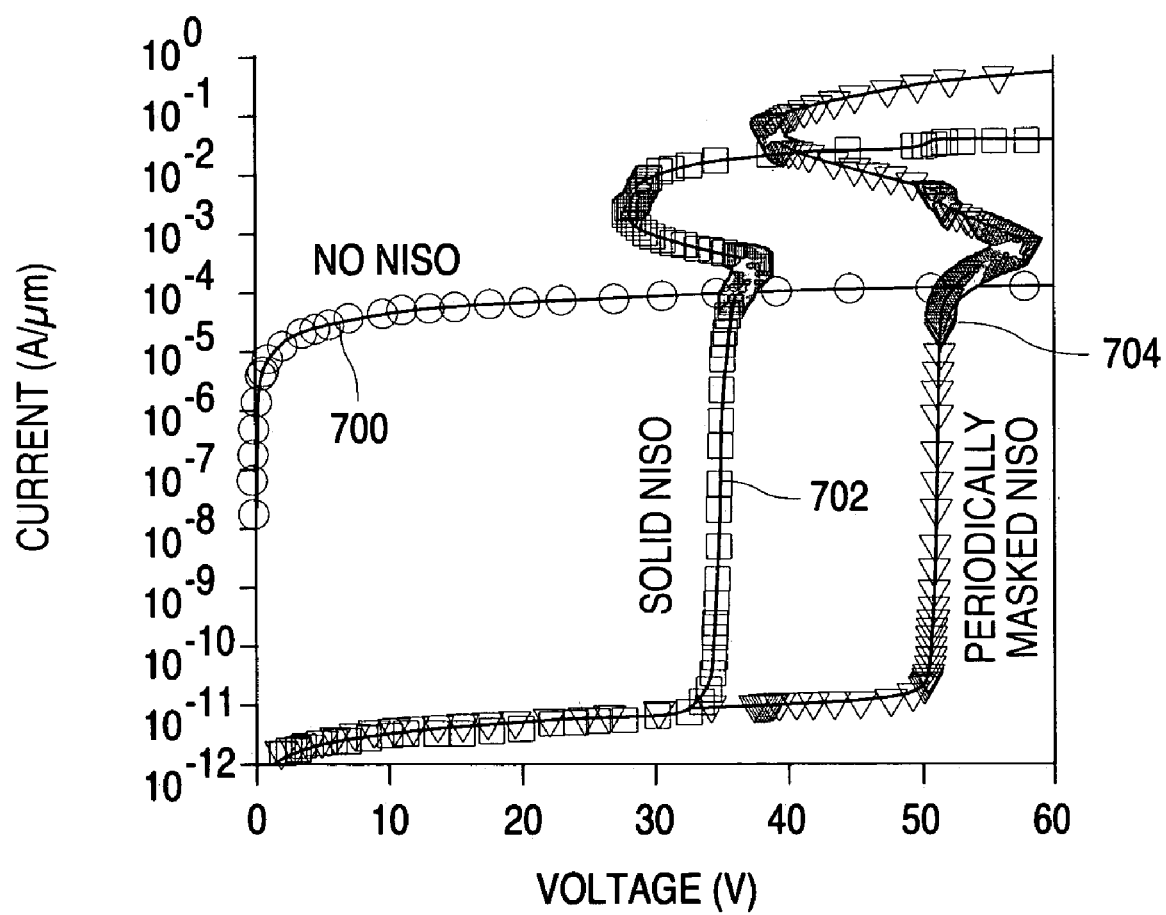
FIG. 7 shows current against voltage curves for a device of the invention compared to prior art devices.

As mentioned above, one application of the invention is in providing the appropriate doping level to a particular isolation region. Also it allows different regions for different devices on a single integrated circuit to be provided with different doping levels by making use of different masks or using a single mask with different numbers and sizes of perforations per unit area. In accordance with the invention, this allows the breakdown voltage of devices to be controlled. When compared to a prior art DIAC device (see FIG. 2) which has a solid isolation region, the present invention allows the breakdown voltage to be increased by reducing the doping level of the isolation region. The effect is shown in the curves of FIG. 7, which will be discussed in greater detail below. It will be appreciated that the breakdown voltage can thus be adjusted by adjusting the size and density of the perforations in the mask during doping of the isolation region. This will become clearer in the discussions that follow below.

Figure 1:
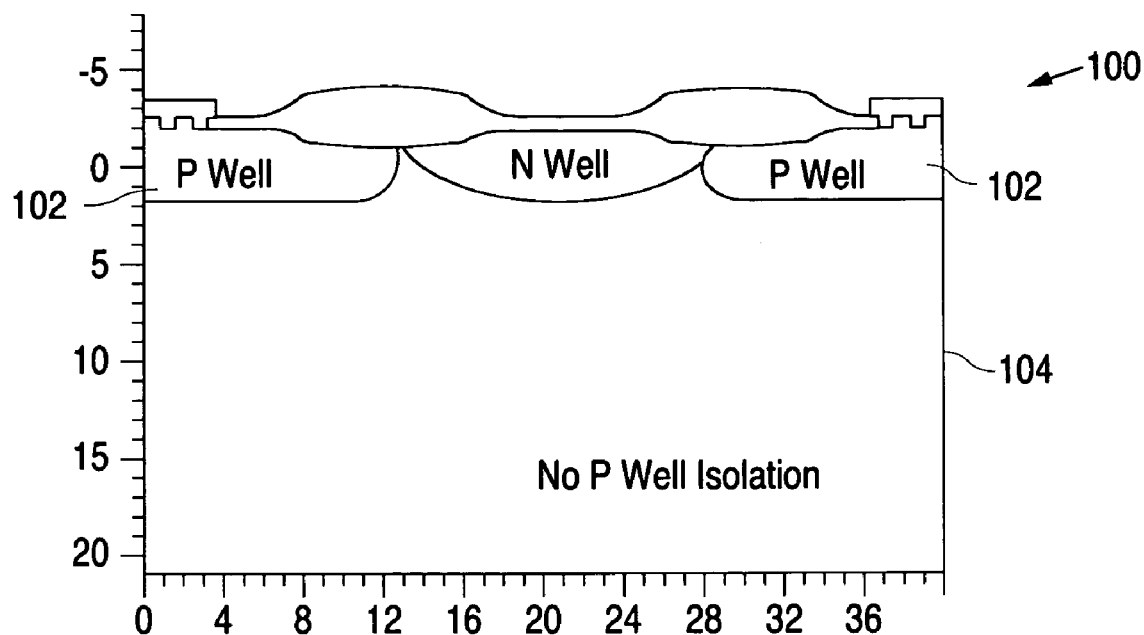
FIG. 1 shows a sectional view of a typical DIAC ESD device without isolation layer.
Figure 2:
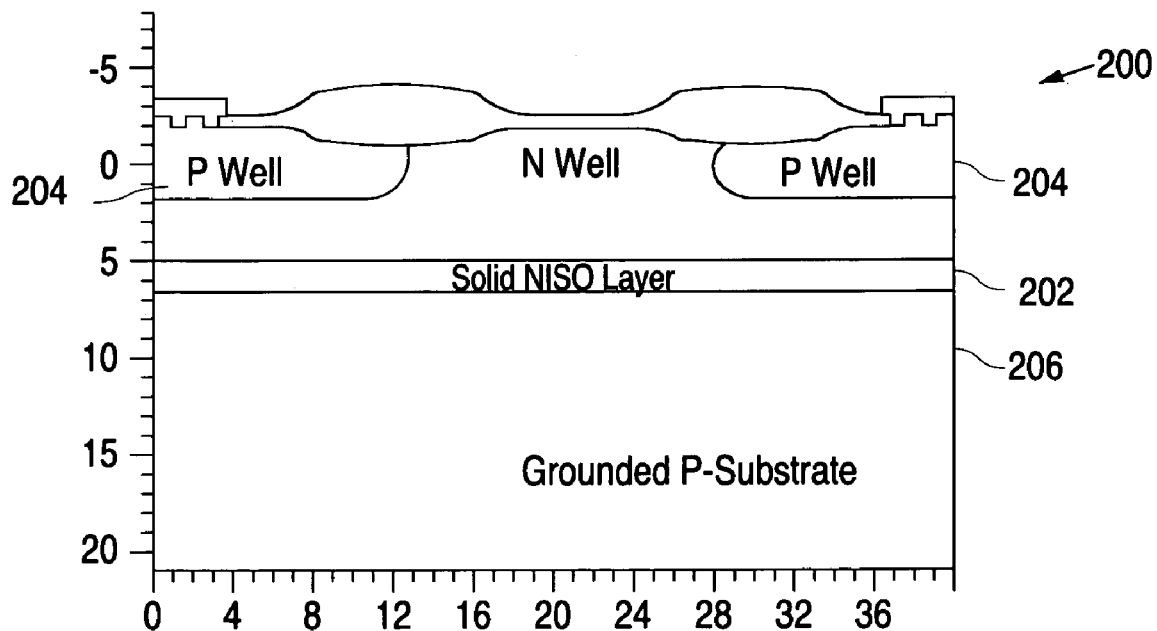
FIG. 2 shows a sectional view of a typical DIAC ESD device with isolation layer.

FIG. 1 shows a prior art DIAC 100 that has p-wells 102 formed in a substrate 104. No isolation region is provided in this device, and the device therefore suffers from substantial leakage. In contrast, the prior art device shown in FIG. 2 shows a DIAC 200 with an isolation region 202 between p-wells 204 and substrate 206. This provides a snapback device with current density versus voltage characteristics as shown by curve 702 in FIG. 7. As can be seen by the curve 702, the breakdown voltage for the device 200 is approximately 35 V.

According to the present invention, this breakdown voltage can be increased by making use of a periodically masked isolation layer. In one embodiment, which made use of ratio of 2000/500 for masked portion to unmasked portion, a breakdown voltage of about 50V was achieved, as shown by the curve 704 in FIG. 7.

Figure 3:
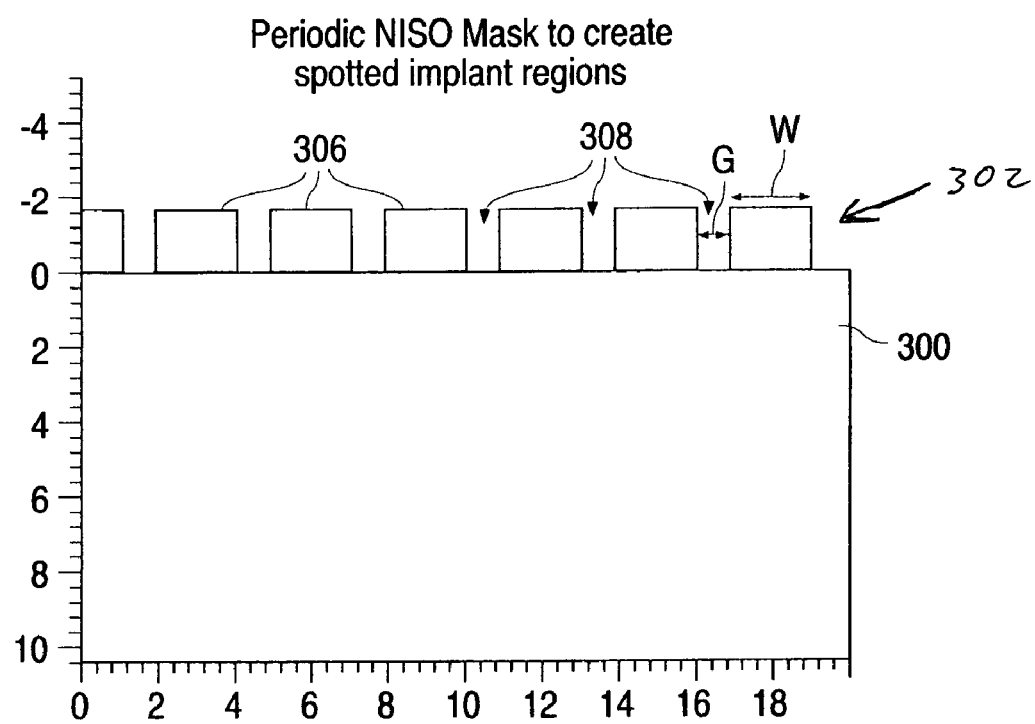
FIG. 3 shows a sectional representation of a snapback device showing a process step of the invention involving a perforated mask.
Figure 4:
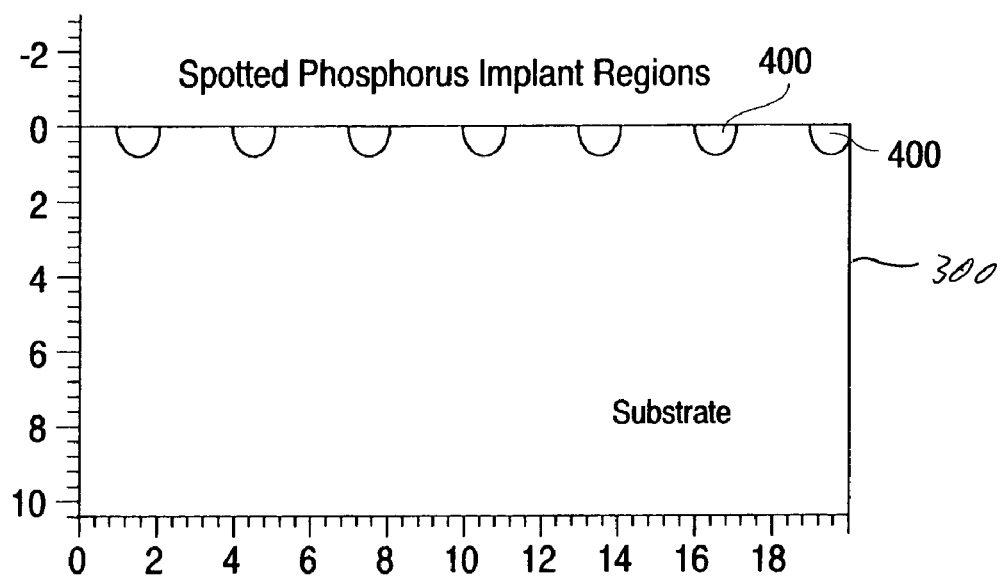
FIG. 4 shows a sectional representation of a snapback device showing a process step of the invention illustrating the dopant implantation.

One approach to achieving such a periodically masked isolation layer is shown in FIGS. 3–6. FIG. 3 shows a p-substrate material 300 before n-epitaxial growth. In accordance with the invention, a periodic mask 302 (comprising photoresist with perforations or openings) is formed over the substrate 300. In this embodiment the photoresist material 306 periodically alternates with perforations or openings 308. By adjusting the width W of the photoresist regions 306 and the gap size G of the openings 308, the density and number of gaps or perforations can be varied per unit area. This will effect the amount of dopant that passes into the substrate as will become clear from FIG. 4. In this case phosphorus was used as the dopant to form spotted implant regions 400 of n-material in the substrate 300 (FIG. 4).

Figure 5:
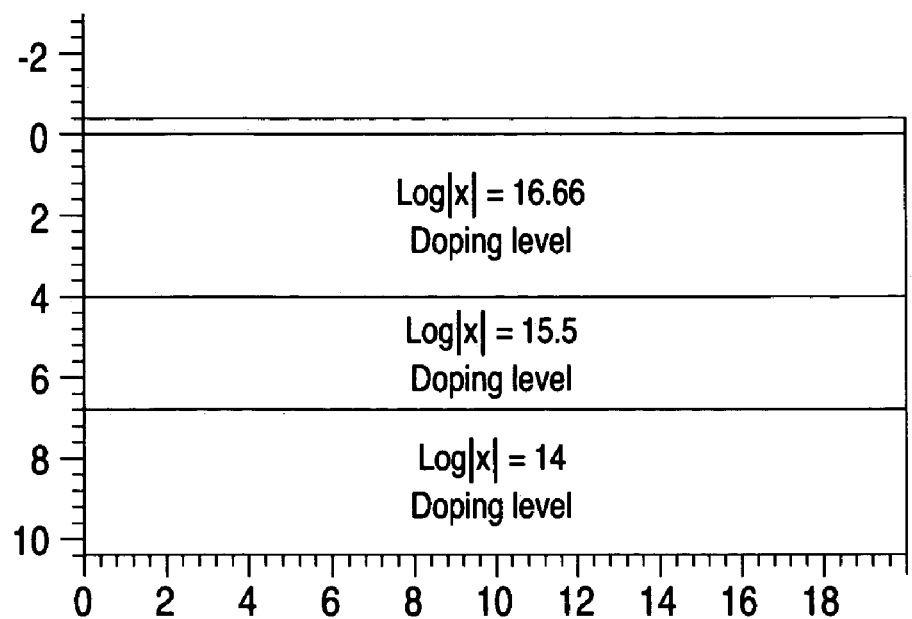
FIG. 5 shows the device of FIG. 4 after high diffusion drive.
Figure 6:
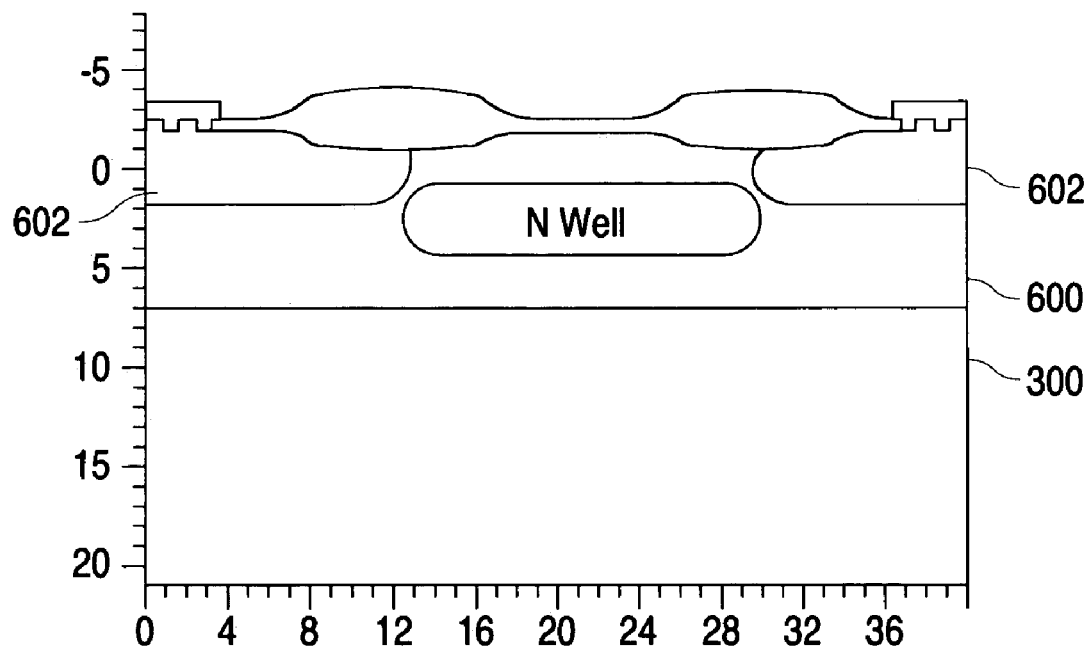
FIG. 6 shows the device of FIG. 5 after the remaining process steps have been completed.

As shown in FIGS. 5 and 6, by making use of high temperature process steps, such as long-term high temperature diffusion during the drive of phosphorus impurities, or by subsequent annealing, the spotted implants form a more uniform region to define an isolation layer 600 between the p-substrate 300 and active regions in the form of p-wells 602. As mentioned above, the Gaussian distribution of the diffusion is a function of time and temperature. Thus, all steps following the diffusion will change the profile. However, an important aspect in determining the final diffusion dimensions is determined by the high diffusion drive and any subsequent epitaxial growth. As also discussed above, in the case of shallow implants, the anneal time and/or the temperature will have to be reduced. It will be appreciated that there may be more than one annealing step, each at a different temperature and performed for a different time. The annealing steps may be additional steps performed or may form part of the regular process of forming the device, such as epitaxial growth of a region.

While the embodiment discussed above provided for forming of the isolation layer before epitaxial growth, the isolation layer could also be formed after epitaxial growth by making use of high diffusion drive.

In the embodiment of FIGS. 3–6 a certain ratio of W to G was used. As part of the invention, the doping density of the isolation layer can be adjusted by adjusting this ratio. The table below shows the results for different ratios, showing how breakdown voltage changes. The table also shows a prior art fully blocked device (mask has no perforations and therefore no isolation layer is formed, which accounts for resistive leakage at 0V) and a prior art unblocked or fully opened device (mask is eliminated and a highly doped isolation region is formed) for comparison.

By providing an isolation layer, the present invention also provides for a device that is bi-directional. Some of the breakdown voltages for negative pad voltages, are also shown in the table below.

| Number | Breakdown voltage | Blocked region W (μm) | Unblocked (open) region (μm) |
| --- | --- | --- | --- |
| 1 | Leakage from 0 V | Fully blocked | 0 |
| 2 | 44.2 | 1 | 1 |
| 3 | 45.7 | 0.5 | 0.5 |
| 4 | 48.9 | 0.6 | 0.4 |
| 5 | 43.3/−43.2 | 2 | 2 |
| 6 | 49.3 | 2 | 1 |
| 7 | 39.7/−39.6 | 1 | 2 |
| 8 | 51.4/−51 | 0.2 | 0.2 |
| 9 | Leakage from 4 V | 2 | 0.2 |
| 10 | Soft pumch through from 40 V | 3 | 0.5 |
| 11 | 64.4/−25 | 2 | 0.5 |
| 12 | 35/−35 | 0 | Fully open |

The embodiment discussed above dealt with forming an isolation layer of controlled impurity density. It will be appreciated that the invention could also be used to control the density of impurity implantation into any other regions in one or more devices on an integrated circuit.

What is claimed is:

1. A method of forming a continuous isolation region of controlled doping level in a substrate below an active region of a snapback device, comprising
   forming a perforated mask with multiple perforations over a silicon substrate,
   implanting dopant through the mask to define multiple spotted implants in the substrate, and
   annealing the device to cause the multiple spotted implants to form the continuous isolation region, wherein the relative size and separation of the perforations in the mask is controlled to control the dopant density of the isolation region.

2. A method of claim 1, further comprising exposing the device to one or more predefined elevated temperatures for predefined times.

3. A method of controlling the breakdown voltage of a snapback device comprising forming an isolation layer in a substrate of said snapback device, and thereafter forming an active region above the isolation layer, wherein forming the isolation layer includes forming spotted implants in the substrate and annealing the device to cause the spotted implants substantially to combine to form said isolation region, the size and separation of the spotted implants is chosen to provide an isolation region of desired doping density.

4. A method of claim 3, wherein the spotted implants are formed by making use of a mask with intermittent openings.

5. A method of claim 3, wherein the spotted implants are provided before one or both of an epitaxial layer being grown and high diffusion drive taking place.

6. A method of claim 3, wherein the snapback device is an ESD protection device.

7. A method of claim 3, further comprising exposing the device to one or more predefined elevated temperatures for predefined times.

* * * * *